(12) United States Patent
Watanabe

(10) Patent No.: US 7,667,745 B2
(45) Date of Patent: Feb. 23, 2010

(54) SIGNAL DETECTING SYSTEM USING A DIFFERENCE IN SAMPLE HOLD CIRCUIT OUTPUTS

(75) Inventor: Koji Watanabe, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 441 days.

(21) Appl. No.: 11/369,732

(22) Filed: Mar. 8, 2006

(65) Prior Publication Data

US 2006/0214699 A1     Sep. 28, 2006

(30) Foreign Application Priority Data

Mar. 8, 2005     (JP) .............................. 2005-063857

(51) Int. Cl.
*H04N 5/217* (2006.01)
*H04N 9/64* (2006.01)

(52) U.S. Cl. ...................... 348/241; 348/243; 250/208.1

(58) Field of Classification Search .................. 348/241, 348/246
See application file for complete search history.

(56) References Cited

U.S. PATENT DOCUMENTS 5,572,155 A * 11/1996 Tamayama .................... 327/94
6,211,914 B1 * 4/2001 Kubo .......................... 348/241
6,476,864 B1 * 11/2002 Borg et al. ................... 348/245
7,133,074 B1 * 11/2006 Brehmer et al. .............. 348/308
2004/0234294 A1 * 11/2004 Nagame et al. .............. 399/159
2005/0226368 A1 * 10/2005 Francke ....................... 378/22
2007/0139710 A1 * 6/2007 Ohta ......................... 358/1.16
2007/0206113 A1 * 9/2007 Nakamura et al. ........... 348/362

FOREIGN PATENT DOCUMENTS

JP          2004-147255 A       5/2004

* cited by examiner

*Primary Examiner*—Sinh Tran
*Assistant Examiner*—Hung H Lam
(74) *Attorney, Agent, or Firm*—Sughrue Mion, PLLC

(57) ABSTRACT

A signal detecting system for reading a charge signal from an image recording medium includes a signal storing circuit, a first low-pass filter into which the charge signals stored in the signal storing circuit are input, a first sample hold circuit which sample-holds the charge signal passing through the first low-pass filter, a second low-pass filter into which the charge signals stored in the signal storing circuit are input, a second sample hold circuit which sample-holds a reference level signal when the input of the charge signal passing through the second low-pass filter is at a reference potential, a difference circuit which outputs as an image signal the difference between the charge signal and the reference level signal, and a controller which controls the initiating timings of the sample hold circuits so that the initiating timing of the first sample hold circuit is earlier than that of the other.

9 Claims, 4 Drawing Sheets

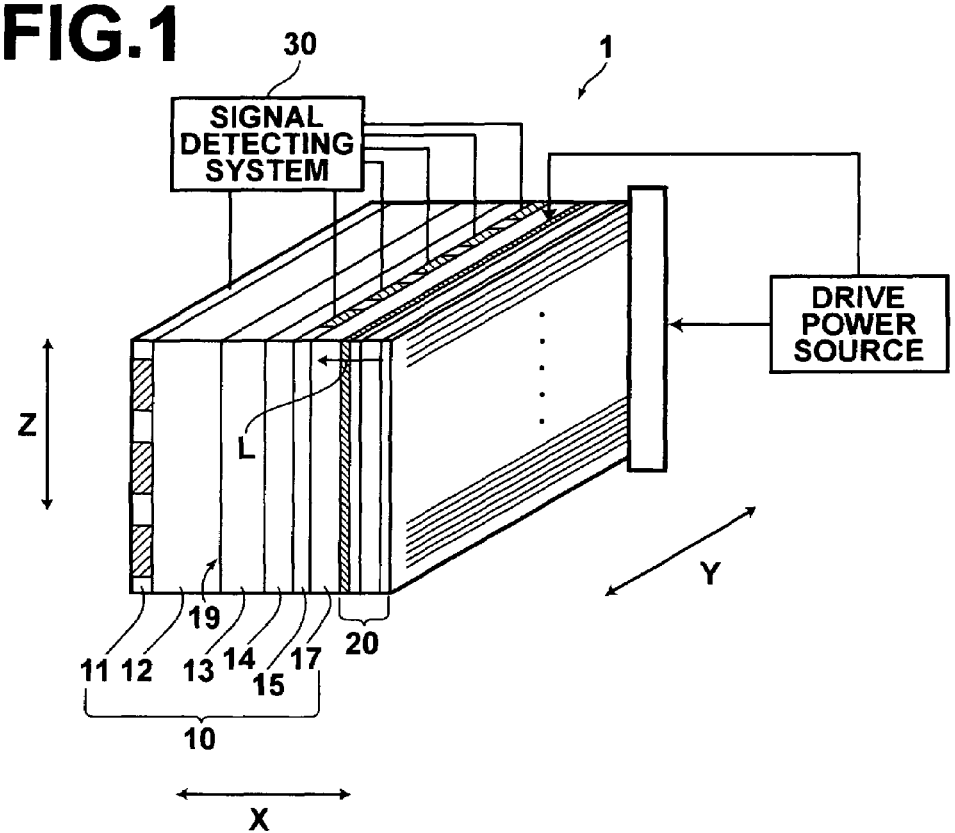
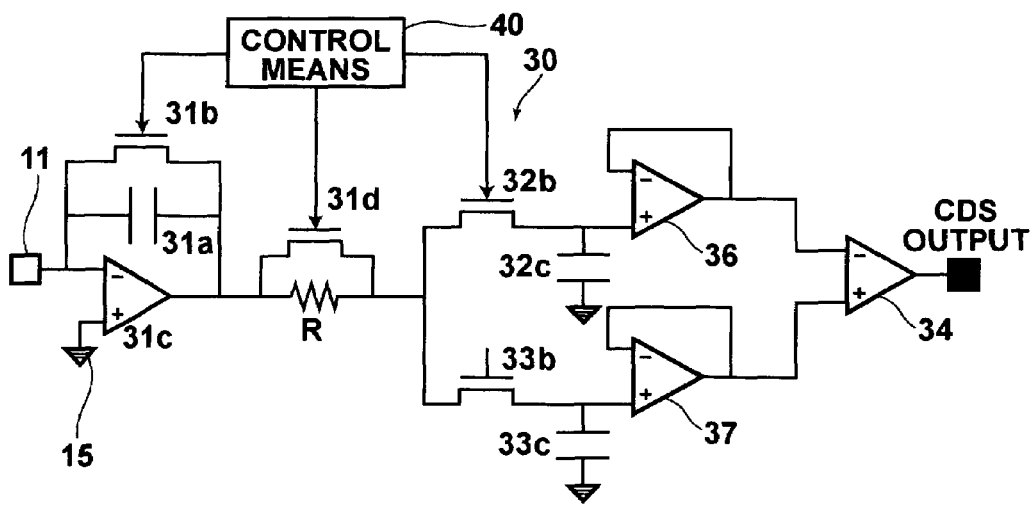

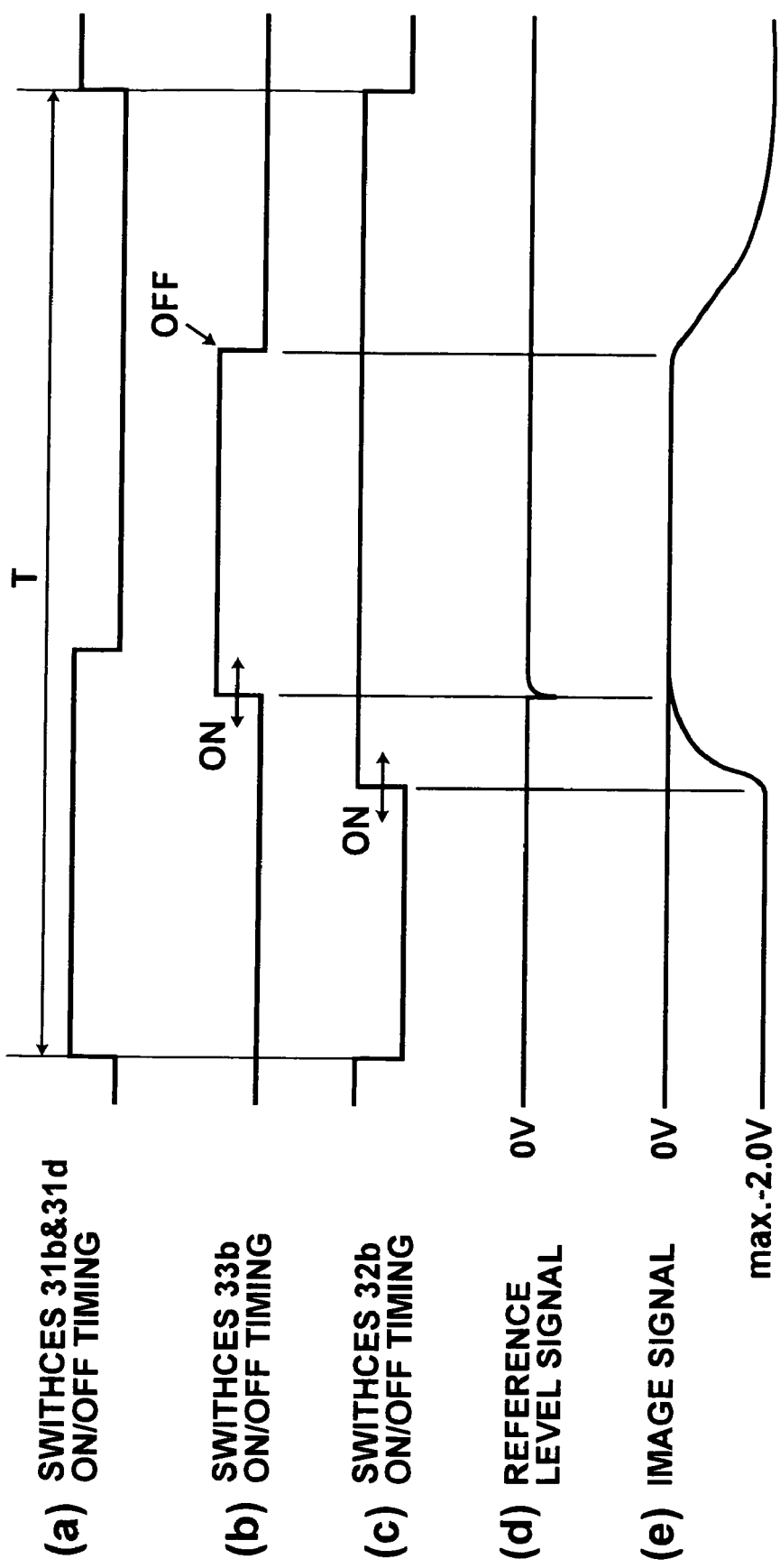

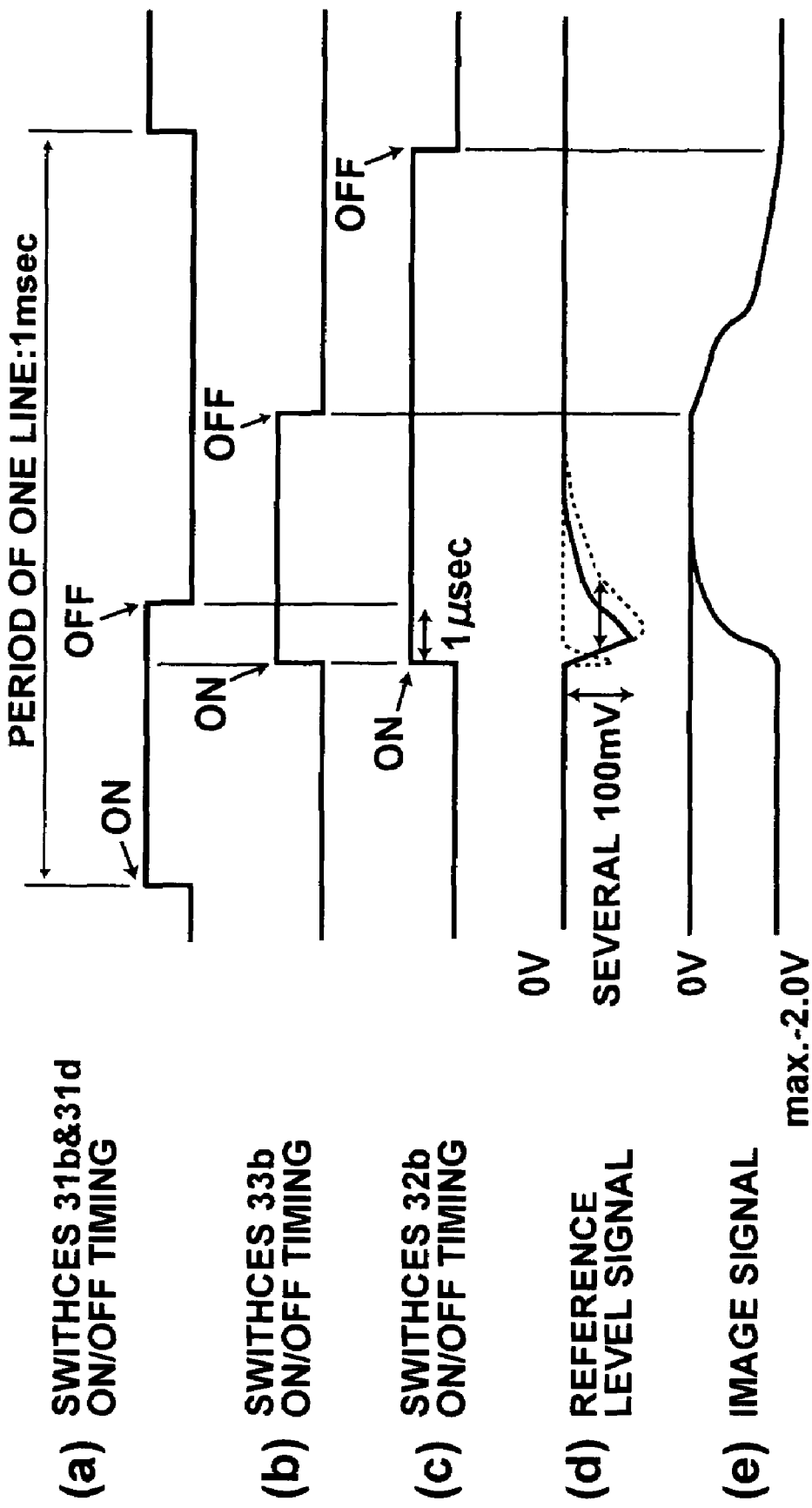

SIGNAL DETECTING SYSTEM USING A DIFFERENCE IN SAMPLE HOLD CIRCUIT OUTPUTS

BACKGROUND OF THE INVENTION

1. Field of the Invention

This invention relates to a signal detecting system which detects an image signal by correlation dual sampling.

2. Description of the Related Art

Conventionally, there has been used in various fields a photoelectric conversion means such as a CCD which receives light and outputs a signal by converting the received light to a charge signal or a photomultiplier or an image read-out system which stores electric charges upon exposure to radiation and outputs a charge signal according to the stored electric charges. A charge amplifier which can be made in the form of an IC and is relatively low in noise has been used as a detector for detecting the charge signal output from the photoelectric conversion means or the image read-out system. The charge amplifier starts to store the charge signals upon switching to a storing mode while discharges the stored charge signals and outputs a charge signal according to the stored electric charges upon switching to a reset mode.

The switching to the storing mode in the charge amplifier is carried out by switching a reset switch from an ON state to an OFF state. kTC noise is generated in response to switching of the reset switch and the generated noise is included in the charge signal which is a component of the signal. In order to avoid the influence of the kTC noise, the correlation dual sampling is carried out. In the correlation dual sampling, the difference between the charge signals respectively output a predetermined baseline sampling time after the signal storing circuit is switched to the storing mode and immediately before the signal storing circuit is switched to the reset mode is taken and by making the difference a signal component, the influence of the kTC noise can be avoided.

In circuits where the correlation dual sampling is carried out, a low-pass filter is provided after the signal storing circuit in order to reduce the high frequency noise in the charge signal output from the signal storing circuit. See, for instance, Japanese Unexamined Patent Publication No. 2004-147255.

When the image information is to be read at high speed by shortening the time required to read one pixel (one cycle), so-called a field-slew period is also shortened. At this time, there is problem that fluctuation of the reference level signal does not converge and the reset noise is included in the reference level signal, whereby the dynamic range deteriorates.

SUMMARY OF THE INVENTION

In view of the foregoing observations and description, the primary object of the present invention is to provide a signal detecting system which can surely prevent generation of the reset noise even if the image information is to be read at high speed from an image recording medium.

In accordance with the present invention, there is provided a signal detecting system for reading a charge signal from an image recording medium in which image information has been recorded as a charge signal comprising a signal storing circuit which stores the charge signals, a first low-pass filter into which at least one of the charge signals stored in the signal storing circuit is input, a first sample hold circuit which sample-holds the charge signal passing through the first low-pass filter, a second low-pass filter into which at least one of the charge signals stored in the signal storing circuit is input, a second sample hold circuit which sample-holds a reference level signal when the input of the charge signal passing through the second low-pass filter is at a reference potential, a difference means which outputs as an image signal the difference between the charge signal output from the first sample hold circuit and the reference level signal output from the second sample hold circuit, and a control means which controls the sample hold initiating timings at which the first and second sample hold circuits initiate their sampling wherein the control means controls the first and second sample hold circuits so that the initiating timing of the first sample hold circuit is earlier than that of the second sample hold circuit.

The image recording medium may be, for instance, a CCD or a solid sensor which records image information as an electrostatic latent image upon exposure to radiation.

The control means may have a function of adjusting the sample hold initiating timings of the first and second sample hold circuits with respect to the reset timing of the signal storing circuit, so long as it controls the sample hold initiating timing of the first sample hold circuit earlier than that of the second sample hold circuit.

In accordance with the signal detecting system of the present invention, since the sample hold initiating timing of the first sample hold circuit is earlier than that of the second sample hold circuit, the residual charge in the first sample hold circuit can be discharged before and fluctuation of the reference level signal from the reference potential can be minimized, whereby even if the period during which the reference level signal is to be stabilized is shortened in order to read the image information at high speed, the reference level signal can be converged to the reference potential during the period and generation of the reset noise can be surely prevented even if the image information is to be read at high speed.

When the control means has a function of adjusting the sample hold initiating timings of the first and second sample hold circuits, the sample hold initiating timings of the first and second sample hold circuits can be adjusted to match the storing/reset timing in the charge storing means.

BRIEF DESCRIPTION OF THE DRAWINGS

FIG. 1 is a view showing a solid sensor employing a signal detecting system of the present invention, FIG. 2 is a preferred embodiment of the signal detecting system of the present invention, FIG. 3 is a graph showing an ON/OFF timing of each of switches in the signal detecting system shown in FIG. 2, FIG. 4 is a graph showing an ON/OFF timing of each of switches in the conventional signal detecting system.

DESCRIPTION OF THE PREFERRED EMBODIMENT

Figure 5:
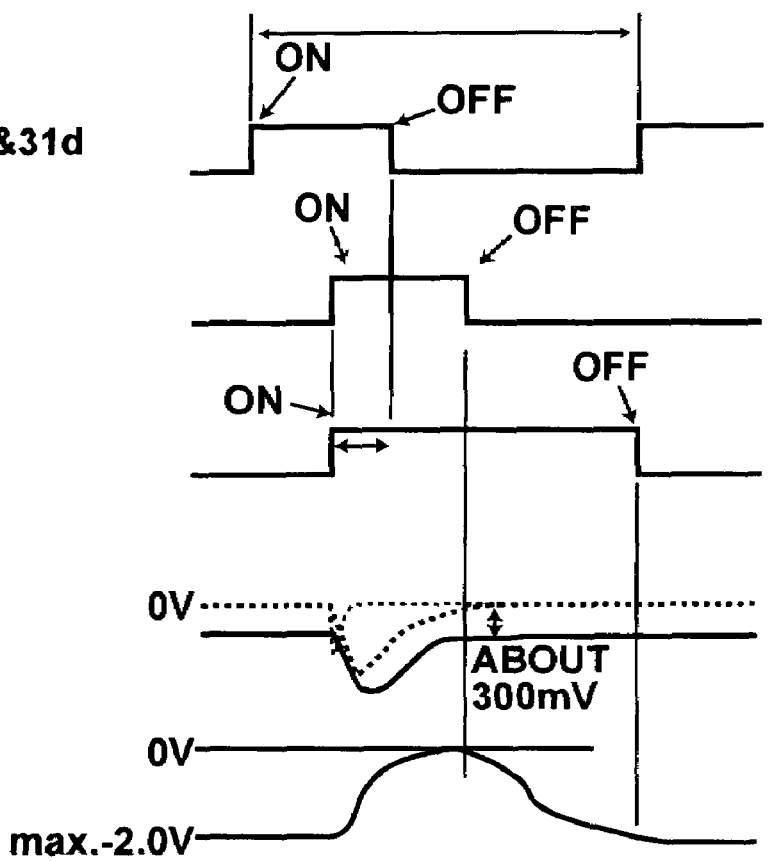
FIG. 5 is a graph showing an ON/OFF timing of each of switches in the signal detecting system shown in FIG. 4 when operated at high speed.

A signal detecting system in accordance with an embodiment of the present invention will be described in detail with reference to the drawings. FIG. 1 shows an image read-out system employing a signal detecting system of the present invention. The image read-out system 1 comprises a solid sensor 10 which is an image recording medium in which image information has been recorded, and a panel-like light source 20 which causes a linear reading light L to scan the solid sensor 10.

First, the solid sensor 10 will be described with reference to FIG. 1. The solid sensor 10 is of so-called an optical read-out system disclosed, for instance, in Japanese Unexamined Patent Publication No. 2000-284056 and comprises a reading electrode 11, a reading photoconductive layer 12, a charge transfer layer 13, a recording photoconductive layer 14 and a second electrode 15 superposed one on another.

The reading electrode 11 is formed by, for instance, nesa film and comprises a plurality of substantially parallel electrodes extending in the direction of arrow Y. The parallel electrodes of the reading electrode 11 are electrically insulated from each other. The reading photoconductive layer 12 comprises, for instance, amorphous selenium and exhibits conductivity and generates charged pairs in response to exposure to reading light. The charge transfer layer 13 is superposed on the reading photoconductive layer 12 and behaves as substantially insulating material to the negative charge while behaves as substantially conductive material to the positive charge. The recording photoconductive layer 14 comprises, for instance, amorphous selenium and exhibits conductivity and generates charged pairs in response to exposure to recording electromagnetic waves (light or radiation). Further, on the recording photoconductive layer 14, is superposed the second electrode 15 comprising a plurality of linear electrodes each of which is formed of material transmitting the recording electromagnetic waves such as ITO (indium tin oxide) film and extending in the direction of arrow Z.

A charge storing portion 19 is formed on the interface 19 between the charge transfer layer 13 and the recording photoconductive layer 14. That is, the electrons generated in the recording photoconductive layer 14 tends to move toward the reading electrode 11 by the electric field formed between the reading electrode 11 and the second electrode 15. The movement of the electrons is suppressed by the charge transfer layer 13, whereby electric charges according to the exposed recording electromagnetic waves are stored as an electrostatic latent image in the charge storing portion 19 and image information is thus recorded in the solid sensor 10.

When image information is recorded in the solid sensor 10, a high voltage is imparted between the reading electrode 11 and the second electrode 15 by a signal detecting system 30. With this, the reading electrode 11 is charged to the negative and the second electrode 15 is charged to the positive. When recording electromagnetic waves are subsequently projected from the second electrode side, positive and negative charged pairs are generated in the recording photoconductive layer 14 according to the exposed recording electromagnetic waves. The positive holes of the charged pairs move toward the second electrode 15 and combined with the negative charges on the second electrode 15 to be cancelled. On the other hand, the electrons of the charged pairs move toward the reading electrode 11. However, the movement of the electrons is suppressed by the charge transfer layer 13, whereby image information is recorded as an electrostatic latent image in the charge storing portion 19.

When reading out image information recorded in the charge storing portion 19, linear recording light beam L1 extending in the direction of arrow Y from the panel-like light source 20 is caused to scan the solid sensor 10 in the direction of arrow X. with this, charged pairs are generated in the reading photoconductive layer 12 according to the amount of the recording light L1 exposed thereto. The positive holes of the generated charged pairs are combined with the negative charges which passes through the charge transfer layer 13 and are stored in the charge storing portion 19 and are cancelled. On the other hand, the electrons of the charged pairs move toward the reading electrode 11 to combine with the positive charges. In response to combination of positive holes with the negative charges in the reading electrode 11, an electric current flows. By detecting the change of the electric current by the signal detecting system 30, the image information in the solid sensor 10 is detected.

FIG. 2 is a circuit diagram showing the signal detecting system 30 in accordance with a preferred embodiment of the present invention. The signal detecting system 30 is a correlation dual sampling circuit which detects charge signals from an image recording medium where image information is recorded as an electric charge signal from a pixel to another and comprises a signal storing circuit 31 (31*a* to 31*d*) which stores the charge signals, a first sample hold circuit 32 which sample-holds the charge signals stored in the signal storing circuit 31, a second sample hold circuit 33 which sample-holds the reference level signal, a difference means 34 which outputs as an image signal the difference between the charge signal output from the first sample hold circuit 32 and the reference level signal output from the second sample hold circuit 33, and a control means 40 which controls the sample hold initiating timings at which the first and second sample hold circuits 32 and 33 initiate their sampling.

The signal storing circuit 31 comprises a capacitor 31*a* which stores charge signals output from the solid sensor 10, a reset switch 31*b* which discharges the charge signals stored in the capacitor 31*a*, and an amplifier 31*c*. When the reset switch 31*b* is in an off state, charge signals are stored in the capacitor 31*a*, and when the reset switch 31*b* is in an on state, charge signals stored in the capacitor 31*a* are output.

The first sample hold circuit 32 is connected to the signal storing circuit 31 by way of a resistor R. The first sample hold circuit 32 comprises a switch 32*b*, a capacitor 32*c* and an amplifier 36. The resistor R and the capacitor 32*c* form a first low-pass filter.

When the switch 32*b* is turned on, sampling is initiated and the charge signals output from the signal storing circuit 31, after they are processed with the first low-pass filter, are input into the first sample hold circuit 32 and are sampled. When the switch 32*b* is subsequently turned off, the output of the first sample hold circuit 32 is held.

The second sample hold circuit 33 is connected to the signal storing circuit 31 by way of a resistor R in parallel to the first sample hold circuit 32. The second sample hold circuit 33 comprises a switch 33*b*, a capacitor 33*c* and an amplifier 37. The resistor R and the capacitor 33*c* form a second low-pass filter.

When the switch 33*b* is turned on, sampling is initiated and the charge signals output from the signal storing circuit 31, after they are processed with the second low-pass filter, are input into the second sample hold circuit 33 and are sampled. When the switch 33*b* is subsequently turned off, the output of the second sample hold circuit 33 is held. The second sample hold circuit 33 is controlled to hold a sample when the charge signal becomes a reference potential so that a reference level signal is output from the second sample hold circuit 33.

The difference means 34 comprises, for instance, a differential amplifier and the first sample hold circuit 32 is connected to a minus terminal of the difference means 34 while the second sample hold circuit 33 is connected to a plus terminal of the difference means 34. The difference means 34 outputs as an image signal the difference between the charge signals output from the first sample hold circuit 32 and the reference level signal output from the second sample hold circuit 33. Then the image signal is digitized by an A/D converter (not shown).

The storing/reset timing of the signal storing circuit 31 and the sample hold timings of the first and second sample hold circuits 32 and 33 are controlled by the control means 40, and as shown in FIG. 3, the control means 40 controls the timings by controlling the switches 31b, 31d, 32b and 33b.

FIG. 3 is a graph showing a time chart for driving the switches shown in FIG. 2. As shown in (a) in FIG. 3, the reset switch 31b of the signal storing circuit 31 in the signal detecting system 30 is turned on before projection of the reading light onto the solid sensor 10 so that the charge signals stored in the capacitor 31a are reset. On the other hand, the reset switch 31b of the signal storing circuit 31 in the signal detecting system 30 is turned off upon initiation of projection of the reading light onto the solid sensor 10 so that the charge signals generated in response to projection of the reading light come to be stored in the capacitor 31a.

As shown in (b) and (c) in FIG. 3, while the reset switch 31b is on, the switch 32b of the first sample hold circuit 32 is turned on. At this time, the switch 33b of the second sample hold circuit 33 is off. With this, as shown in (e) in FIG. 3, the residual charge signals remaining in the capacitor 32c are output from the difference means 34 and converge onto 0 as the time lapses.

Then as shown in (c) in FIG. 3, while both the reset switch 31b and the switch 32b are on, the switch 33b of the second sample hold circuit 33 is turned on, whereby, since the potentials at the opposite ends of the capacitors 32c and 33c tend to equalize each other, the charge signals held by the capacitor 33c flows into the first sample hold circuit 32 and the reference level signal converges on the reference potential (e.g., 0V) with an elapse of time though once fluctuates as shown in (d) in FIG. 3.

When the fluctuation of the reference level signal converges, the switch 33b is turned off, the output of the second sample hold circuit 33 is held to be the reference level signal. Then the difference between the reference level signal and the charge signal is output as the image signal from the difference means 34 while the switch 32b is on as shown in (e) in FIG. 3.

When the switch 32b is thus turned on earlier than the switch 33b, fluctuation of the reference level signal is minimized. Accordingly, even if so-called a field-slew period is shortened in response to that the read-out is carried out at high speed, the reset noise can be surely removed.

Conventionally, the first and second sample hold circuits 32 and 33 are controlled to simultaneously initiate sampling, for instance, 1 μsec before the reset switch 31b is turned off as shown in (a) to (c) in FIG. 4. At this time, the fluctuation of the reference level signal converges on the reference potential (0V) at a slew rate according to the time constant determined by the wiring resistance and the capacitors 32c and 33c. When the switches 32b and 33b are both turned on with the reference level signal held at the reference potential (0V), the potentials at the opposite ends of the first and second sample hold circuits 32 and 33 tend to equalize each other since the first and second sample hold circuits 32 and 33 are connected in parallel to each other.

Since the charge signal in the preceding charge signal detection is held in the capacitor 32c and the capacitor 33c is at the reference potential (0V), the charge signal in the capacitor 32c flows into the capacitor 33c and the reference level signal output from the second sample hold circuit 33 fluctuates.

The fluctuation of the reference level signal converges within the time when the time required for the second sample hold circuit 33 to hold potential of the capacitor 33c is long, and the reference level signal is at the reference potential (0V) by the time for reading the stored charge (where the switch 32b is on and the switch 33b is off). When the reading time T of one pixel is, for instance, 1 msec, the reference level signal can be converged on the reference potential.

However, when the reading time T is set at 500 μsec to read the image information at high speed, the period during which the switches 32b and 33b are both on is short as shown in FIG. 5. Accordingly, the fluctuation of the reference level signal does not converge before the second sample hold circuit 33 holds the potential of the capacitor 33c, and the reference level signal is not at the reference potential (0V) but at, for instance, 300 mV, whereby the image signal to be output from the difference means 34 deteriorates by the noise and the dynamic range thereby deteriorates.

In order to avoid this problem, the control means 40 controls the first and second sample hold circuits 32 and 33 so that the initiating timing of the first sample hold circuit 32 is earlier than that of the second sample hold circuit 33. With this arrangement, since the residual charge signal in the capacitor 32c has been discharged, fluctuation of the reference level signal becomes very slight and the time for the reference level signal to converge on the reference potential can be shortened, whereby even if the period during which the reference level signal is to be stabilized is shortened in order to read the image information at high speed, the reference level signal can be converged to the reference potential during the period and generation of the reset noise can be surely prevented even if the image information is to be read at high speed.

In accordance with the embodiment described above, since the control means 40 controls the first and second sample hold circuits 32 and 33 so that the initiating timing of the first sample hold circuit 32 is earlier than that of the second sample hold circuit 33, fluctuation of the reference level signal from the reference potential is minimized, even if the period during which the reference level signal is to be stabilized is shortened in order to read the image information at high speed, the reference level signal can be converged to the reference potential during the period and generation of the reset noise can be surely prevented even if the image information is to be read at high speed.

The present invention need not be limited to the embodiment described above. For example, the control means 40 may have a function of adjusting the sample hold initiating timings of the first and second sample hold circuits 32 and 33. With this arrangement, the sample hold initiating timings of the first and second sample hold circuits 32 and 33 can be adjusted to match the storing/reset timing in the signal storing circuit 31.

Further, though in the embodiment described above, a radiation image sensor of so-called an optical reading system is employed as what outputs the charge signals to be input into the signal detecting system in FIG. 1, a radiation image sensor of so-called a TFT system may be employed. Further, a radiation image sensor which detects the evanescent light emitted from a stimulable phosphor sheet with a photoelectric converter element and outputs a charge signal may be employed. Further, it may be a correlation dual sampling circuit which reads out the charge signal stored in each pixel of a CCD.

What is claimed is:

1. A signal detecting system for reading a charge signal from an image recording medium in which image information has been recorded as a charge signal comprising
   a signal storing circuit which stores the charge signals,
   a first low-pass filter into which at least one of the charge signals stored in the signal storing circuit is input,
   a first sample hold circuit which sample-holds the charge signal passing through the first low-pass filter, a second low-pass filter into which at least one of the charge signals stored in the signal storing circuit is input, a second sample hold circuit which sample-holds a reference level signal when the input of the charge signal passing through the second low-pass filter is at a reference potential, a difference means which outputs as an image signal the difference between the charge signal output from the first sample hold circuit and the reference level signal output from the second sample hold circuit, and a control means which controls the sample hold initiating timings at which the first and second sample hold circuits initiate their sampling, wherein the control means controls the first and second sample hold circuits so that the initiating timing of the first sample hold circuit is earlier than that of the second sample hold circuit; and wherein the first sample hold circuit passes the charge signals during an overlapping time period with a reset switch being open and the second sample hold circuit being turned off.

2. A signal detecting system as defined in claim 1 in which the control means has a function of adjusting the sample hold initiating timings of the first and second sample hold circuits.

3. A signal detecting system as defined in claim 1 in which the image recording medium is a solid sensor in which image information is recorded as an electrostatic latent image upon exposure to radiation.

4. A signal detecting system as defined in claim 1 wherein the first sample hold circuit is on for a duration of a time period beginning prior to the second sample hold circuit being turned on and ending subsequent to the second ample hold circuit being turned off.

5. A signal detecting system as defined in claim 1, wherein the second sample hold circuit is connected to the positive terminal of the difference means.

6. A signal detecting system as defined in claim 1, wherein the signal storing circuit is equipped with a charge amplifier which comprises a capacitor that stores said charge signals, a reset switch which discharges the charge signals stored in the capacitor, and an amplifier.

7. A signal detecting system as defined in claim 6, wherein the first sample hold circuit and the second sample hold circuit are turned on prior to the charge amplifier beginning to integrate the charge signals.

8. A signal detecting system as defined in claim 6, wherein a period during which the second sample hold circuit is turned on is shorter than the integration period of the charge amplifier.

9. A signal detecting system for reading a charge signal from an image recording medium in which image information has been recorded as a charge signal comprising a signal storing circuit which stores the charge signals, a first low-pass filter into which at least one of the charge signals stored in the signal storing circuit is input, a first sample hold circuit which sample-holds the charge signal passing through the first low-pass filter, a second low-pass filter into which at least one of the charge signals stored in the signal storing circuit is input, a second sample hold circuit which sample-holds a reference level signal when the input of the charge signal passing through the second low-pass filter is at a reference potential, a difference means which outputs as an image signal the difference between the charge signal output from the first sample hold circuit and the reference level signal output from the second sample hold circuit, and a control means which controls the sample hold initiating timings at which the first and second sample hold circuits initiate their sampling, wherein the control means controls the first and second sample hold circuits so that the initiating timing of the first sample hold circuit is earlier than that of the second sample hold circuit;

wherein the first sample hold circuit is on for a duration of a time period beginning prior to the second sample hold circuit being turned on and ending subsequent to the second ample hold circuit being turned off.

* * * * *